United States Patent [19]

Rupprecht et al.

[11] Patent Number: 4,593,307
[45] Date of Patent: Jun. 3, 1986

[54] HIGH TEMPERATURE STABLE OHMIC CONTACT TO GALLIUM ARSENIDE

[75] Inventors: Hans S. Rupprecht, Yorktown Heights; Sandip Tiwari, Ossining, both of N.Y.

[73] Assignee: International Business Machines Corporation, Armonk, N.Y.

[21] Appl. No.: 509,732

[22] Filed: Jun. 30, 1983

[51] Int. Cl.⁴ .......................................... H01L 23/48
[52] U.S. Cl. ...................................... 357/67; 357/61; 357/63; 357/65; 357/71
[58] Field of Search ...................... 357/63, 65, 61, 67, 357/71

[56] References Cited

U.S. PATENT DOCUMENTS

| | | | |
|---|---|---|---|
| 3,914,785 | 10/1975 | Ketchow | 357/63 |
| 3,987,480 | 10/1976 | Diguet et al. | 357/65 |
| 4,011,583 | 3/1977 | Levinstein et al. | 357/67 |
| 4,188,710 | 2/1980 | Davey et al. | 357/67 X |
| 4,298,403 | 11/1981 | Davey et al. | 357/65 X |
| 4,398,963 | 8/1983 | Stall et al. | 357/65 X |
| 4,400,221 | 8/1983 | Rahilly | 357/61 X |

OTHER PUBLICATIONS

Anderson, Jr. et al., "Development of Ohmic Contacts for GaAs Devices Using Epitaxial Ge Films," *IEEE Journal of Solid-State Circuits*, vol. SC-13, No. 4, Aug. 78, pp. 430-435.
Anderson, Jr., et al., "Laser Annealed Ta/Ge and Ni/Ge Ohmic Contacts to GaAs," *IEEE Electron Device Letters*, vol. EDL-2, No. 5, May 1981, pp. 115-117.
Sinha et al., "Sintered Ohmic Contacts to N- and P-Type GaAs," *IEEE Transactions on Electron Devices*, vol. ED-22, No. 5, May 19, 1975, pp. 218-224.

*Primary Examiner*—Andrew J. James
*Assistant Examiner*—William A. Mintel
*Attorney, Agent, or Firm*—Thomas J. Kilgannon

[57] ABSTRACT

This invention relates generally to ohmic contacts to substrates made of III-V compounds and to a process for fabricating such contacts. More specifically, the invention is directed to a contact to gallium arsenide having a given level of n-type dopant therein, a region of the substrate doped with germanium and a layer of a germanide of a refractory metal selected from the group consisting of molybdenum, tungsten and tantalum disposed on the substrate. Still more specifically, the invention relates to an ohmic contact to gallium arsenide which includes an interface region of germanium heavily doped with arsenic disposed between the region doped with germanium and the layer of germanide. The contact is formed by evaporating germanium and a refractory metal selected from the group consisting of molybdenum, tungsten and tantalum on the surface of an n-type gallium arsenide substrate and sintering the substrate in a reducing atmosphere for a time and at a temperature sufficient to form the first-to-form germanide of the refractory metal. The resulting contact is stable, has a very low contact resistance and may be subjected to later high temperature processing steps without affecting its characteristics.

6 Claims, 2 Drawing Figures

HIGH TEMPERATURE STABLE OHMIC CONTACT TO GALLIUM ARSENIDE

TECHNICAL FIELD

This invention relates generally to stable ohmic contacts to substrates which include III-V compounds and to methods of fabrication for such contacts. More specifically, the invention is directed to an n-doped substrate of gallium arsenide which has a region doped with germanium disposed therein and a layer of a germanide of a refractory metal such as molybdenum, tungsten or tantalum disposed on the substrate. The contact also includes an interface region of germanium heavily doped with arsenic disposed between the region doped with germanium and the layer of the germanide. The contact is formed by evaporating germanium and a refractory metal such as molybdenum, tungsten or tantalum on the surface of a gallium arsenide substrate and sintering the substrate in a reducing atmosphere for a time and at temperature sufficient to form the first-to-form germanide of the refractory metal. The first-to-form germanides of molybdenum, tungsten and tantalum are $MoGe_2$, $WGe_2$ and $TaGe_2$, respectively. The range of time and temperature are 5–15 minutes and 725°–775° C., respectively.

BACKGROUND OF THE INVENTION

In the fabrication of semiconductor devices, one of the more esoteric problems which arises is in providing a contact to a semiconductor substrate which is compatible with both the substrate and the metallurgy which interconnects with other contacts on the same substrate. This is no simple matter in view of the fact that factors like the kind of semiconductor, the doping of the semiconductor and the type of metals involved may influence whether the resulting contact is ohmic or rectifying.

U.S. Pat. No. 3,987,480 filed May 17, 1974 shows a gallium arsenide substrate with an ohmic contact to a high resistivity region. It shows tantalum and germanium being coevaporated on gallium arsenide and being heated between 400° and 600° C. in a neutral or reducing atmosphere for 10 to 30 minutes. Under these circumstances, a germanide of tantalum is not formed in that the temperature utilized is insufficient to form the first-to-form germanide of tantalum.

U.S. Pat. No. 4,011,583 filed May 27, 1976 shows an ohmic contact to n-type III-V semiconductors in which a metallurgical combination including germanium and palladium is formed on the semiconductor surface either in the form of an alloy or discrete layers. The resulting structure is heated for five minutes to two hours in a temperature range of 200°–700° C. The reference suggests that palladium rich compounds such as $Pd_2Ge$ are formed. Palladium is not, however, a refractory metal and the resulting ohmic contact has a contact resistance higher than that of the present invention.

U.S. Pat. 4,188,710 filed Aug. 11, 1978 shows a gallium arsenide substrate with a layer of epitaxial germanium formed thereon. After this, a layer of tungsten, tantalum or molybdenum is formed over the germanium layer. The structure is annealed at a temperature of 400° C. to 500° C. for thirty minutes. In this reference, no germanide layer whatsoever is formed in view of the annealing temperatures used. Using the technique of the patent, contact resistance of the order of $10^{-4}$ ohm $cm^2$ are obtainable as opposed to the contact resistance of contacts made in accordance with the teaching of the present invention which are approximately two orders of magnitude better.

It is, therefore, an object of the present invention to provide a high-temperature, ohmic contact to binary and ternary compounds of gallium and arsenic. Another object is to provide an ohmic contact to n-type GaAs which is highly reliable and maintains stable characteristics under high temperature processes.

Still another object is to provide an ohmic contact wherein the contact resistance is several orders of magnitude smaller than prior art contacts to n-type GaAs.

Yet another object is to provide an ohmic contact to n-type gallium arsenide wherein the metals used cause the underlying gallium arsenide to become more n-type as result of reacting preferentially with gallium thereby creating excess gallium vacancies and permitting heavier doping with germanium.

Still another object is to provide a contact forming process to III-V compound semiconductors by preferentially forming germanides of certain refractory metals by sintering at a temperature and a time sufficient to form the first-to-form germanides of such metals.

BRIEF SUMMARY OF THE INVENTION

The present invention relates to high temperature, stable contacts to gallium arsenide substrates. Successive layers of n-doped gallium arsenide, germanium heavily n-doped with arsenic or undoped, and a layer of molybdenum, tungsten or tantalum are disposed on the surface of a gallium arsenide substrate and heated to a temperature and for a time sufficient to form the first-to-form germanides of the metals. Alternatively, germanium and one of the above mentioned refractory metals may be coevaporated atop the gallium arsenide substrates and the germanides are formed upon heating. As a result of the heating or sintering, a contact structure is formed which comprises a substrate of a III-V compound having a given level of n-type dopant therein, a region of the substrate doped with germanium and a layer of germanide of a refractory metal disposed on the substrate. The contact further includes an interface region of germanium heavily doped with arsenic disposed between the substrate region doped with germanium and the layer of germanide. The resulting contact has extremely low contact resistance compared with contacts of the same material which have been formed at temperatures lower than the germanide forming temperature and have stable characteristics under further high temperature processing steps.

These and other objects, features and advantages will be more apparent from the following more particular description of the preferred embodiments.

DESCRIPTION OF THE PREFERRED EMBODIMENT

Figure 1:
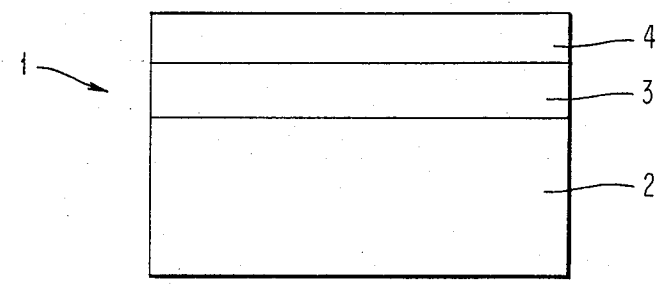
FIGS. 1 and 2 are sectional views of a semiconductor device in accordance with the teaching of the present invention illustrating the structure before and after the heating or sintering step, respectively, of the present invention.

Referring now to FIG. 1, there is shown therein a cross-sectional view of a semiconductor device 1 which includes a substrate 2 of an n-doped III-V compound semiconductor material such as gallium arsenide. In a typical device in accordance with the teaching of the present invention, substrate 2 is doped with an n-type conductivity material such as silicon to a level $1 \times 10^{17}$ cm$^{-3}$. A layer 3 of germanium heavily n-doped with a dopant such as arsenic is disposed atop substrate 2. Alternatively, layer 3 may be undoped. Layer 4 which is disposed atop layer 3 is a layer of refractory metal which may be molybdenum, tungsten or tantalum. At this point, it should be appreciated that layer 3 of germanium may be amorphous rather than single crystal in structure. As will be seen hereinafter, in the prior art, layers of germanium and gallium arsenide must be grown as single crystals without any surface contamination resulting in abrupt discontinuities at the germanium-gallium arsenide interface which can be the cause of problems. If layer 3 is doped, it is doped to a level of $10^{20}$ cm$^{-3}$ with arsenic.

Figure 2:
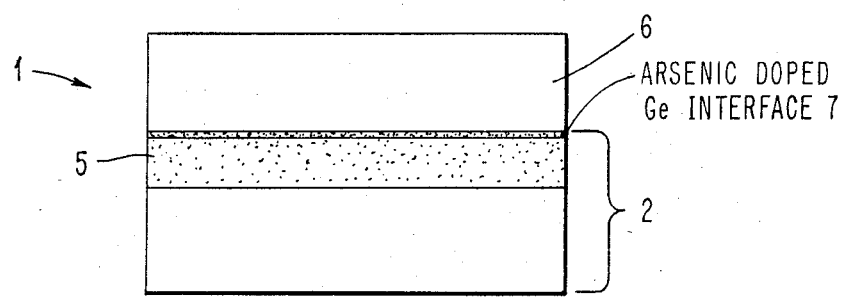

While the arrangement of FIG. 1 has been shown as constituting a plurality of layers, it should be appreciated that the germanium of layer 3 and the refractory metal of layer 4 may be vacuum evaporated simultaneously from two sources of germanium and the refractory metal using apparatus and in a manner well-known to those skilled in the vacuum deposition arts. FIG. 2 shows a cross-sectional view of the structure of FIG. 1 after being subjected to a sintering or annealing step at a temperature in the range of 700°–800° C. for a time period of 5–15 minutes in a nonoxidizing atmosphere. Hydrogen, a reducing gas, argon, a noble gas or nitrogen may be used. As a result of the heating step, a stippled region 5 of substrate 2 is doped with germanium and a refractory metal germanide layer 6 forms at the surface of substrate 2 and is spaced therefrom by a thin interface layer 7 of arsenic doped germanium. Layer 6 may be MoGe$_2$, WGe$_2$ or TaGe$_2$ which are the first-to-form germanides of the refractory metals. Of these, MoGe$_2$ provides the lowest contact resistance and is, therefore, the preferred embodiment of the present invention.

When molybdenum is used for layer 4, sintering at a temperature of 725°–775° C. for a period of seven minutes provides the best results. In general, as has been indicated hereinabove, the sintering step should be carried out in a nonoxidizing atmosphere at a temperature and for a time sufficient to form the first-to-form germanides of the refractory metals molybdenum, tantalum or tungsten. Significantly, the temperatures at which these germanides form do not permit the reaction of the refractory metal with either gallium or arsenic in the substrate. As a result, region 5 in substrate 2 is formed by the diffusion of germanium into the gallium arsenide of substrate 2. The diffusion is necessary to break through any oxide or contaminating region and to provide a uniform germanium contact represented by germanium interface layer 7 to the heavily germanium doped n+ gallium arsenide substrate 2. The presence of region 5 also removes any conduction band edge discontinuity at the germanium/gallium arsenide interface by eliminating any abrupt metallurgical changes.

In order to produce a good ohmic contact to gallium arsenide, the following criteria should be met:

(i) After the high temperature sintering step, a germanium layer like germanium interface layer 7 in FIG. 2, however thin, should remain or become heavily doped n-type (n≃$5 \times 10^{19}$ cm$^{-3}$).

(ii) At the end of the diffusion, germanium should have a high peak concentration at the germanium/gallium arsenide interface. This requires a high solubility limit of germanium in gallium arsenide.

(iii) Germanium should preferentially dope gallium arsenide n-conductivity type. Germanium therefore, should preferentially occupy gallium sites in the gallium arsenide.

The formation of the refractory metal germanide layer 6 as shown in FIG. 2 as an integral part of the ohmic contact structure serves the following functions:

(a) Layer 6 provides a high conductivity film for low resistance access to the contact. Only a small area interconnection need be provided to layer 6 to contact the ohmic area.

(b) Layer 6 permits the out-diffusion of gallium instead of arsenic for preferential site occupation by germanium. Gettering of gallium is not excessive.

(c) Layer 6 forms an acceptable barrier to any changes in the ohmic contact property which might occur as a result of metallurgical reaction with other contacting metals deposited on layer 6.

In addition to the above, the refractory metal germanides of layer 6 have none or sufficiently small reactivity with excess germanium to allow the driving of germanium into gallium arsenide at the sintering temperature.

Finally, germanide layer 6 should have no reactivity or sufficiently small reactivity with arsenic to prevent any changes in the heavily doped n-type character of germanium. The resulting low reactivity of layer 6 and the presence of arsenic in germanium prevent any arsenic out-diffusion from gallium arsenide substrate 2. Since the refractory metal elements have small electronegativity, they have very low reactivity with gallium and arsenic. The stable phase richest in germanium with the least solubility of excess germanium is realized in the formation of the first-to-form germanides of molybdenum, tungsten and tantalum which are MoGe$_2$, WGe$_2$ and TaGe$_2$, respectively.

In a representative structure, substrate 2 has a thickness of 500 microns, region 5 has a depth of 0.3 microns, germanium interface layer 7 has a thickness of 50–100 Å and refractory metal germanide layer 6 has a thickness of 0.10 microns. Where molybdenum is utilized to form the germanide, the resulting ohmic contact has a contact resistance of $10^{-6}$ ohm cm$^2$. This contact resistance is two orders of magnitude better than contacts using similar materials but which do not have a refractory metal germanide as an integral part of the contact structure.

While diffusion has been indicated as the mechanism whereby germanium doped gallium arsenide region 5 is formed, it should be appreciated that other mechanisms such as ion implantation may be invoked without departing from the spirit of the present application. Thus, germanium may be implanted in substrate 2 deeply enough to dope substrate 2 with a peak doping at the germanium/arsenide interface. Any resulting damage can then be annealed to reform an undamaged gallium arsenide substrate 2.

While gallium arsenide has been shown to be the preferred substrate material and silicon the preferred n-type substrate dopant, it should be appreciated that other n-type dopants such as sulphur, tellurium, selenium and tin may also be used. Also, substrates of ternary compounds like gallium aluminum arsenide may be utilized with the same n-type dopants. Other III-V compounds like indium phosphide may be used with the same n-type dopants. In all of the above instances, germanium doped with the Group V element of the substrate or without dopant may be utilized without departing from the spirit of the present invention.

All other III-V compounds are expected to behave in the same manner as gallium arsenide when contacts to it are made as described above. In general, a germanium layer doped with the Group V element of the compound semiconductor may be used together with the germanide forming refractory metals providing ohmic contacts to substrates having contact resistances which are orders of magnitude lower than those provided when germanides are not formed.

Having thus described our invention, what we claim as new, and desire to secure by Letters Patent is:

1. A semiconductor device comprising:
    a substrate of a Group III-V compound having a given uniform concentration of n-type dopant therein,
    a region of said substrate doped with germanium,
    a layer of a germanide of refractory metal molybdenum disposed over said substrate, and,
    a interface region of germanium heavily doped with Group V element of said Group III-V compound disposed between said region and said layer of germanide, said interface region having a thickness of 100 Angstroms or less, said device having a contact resistance of $10^{-6}$ ohm cm$^2$.
2. A semiconductor device according to claim 1 wherein said III-V compound is gallium arsenide and said n-type dopant is silicon.
3. A semiconductor device according to claim 1 wherein said Group V element is arsenic.
4. A semiconductor device according to claim 1 wherein said n-type dopant is present in said substrate in a concentration of about $1 \times 10^{17}$ $cm^{-3}$.
5. A semiconductor device according to claim 1 wherein said interface region of germanium is 50-100 Å thick.
6. A semiconductor device according to claim 4 wherein arsenic is present in said interface region of germanium in a concentration of about $5 \times 10^{19}$ $cm^{-3}$.

* * * * *